United States Patent [19]
Vogt et al.

[11] Patent Number: 5,430,890
[45] Date of Patent: Jul. 4, 1995

[54] RADIO RECEIVER FOR MOBILE RECEPTION WITH SAMPLING RATE OSCILLATOR FREQUENCY BEING AN INTEGER-NUMBER MULTIPLE OF REFERENCE OSCILLATION FREQUENCY

[75] Inventors: Lothar Vogt, Hohenhameln; Stefan Bartels; Djahanyar Chahabadi, both of Hildesheim; Detlev Nyenhuis, Sibbesse; all of Germany

[73] Assignee: Blaupunkt-Werke GmbH, Hildesheim, Germany

[21] Appl. No.: 979,610

[22] Filed: Nov. 20, 1992

[51] Int. Cl.⁶ .............................................. H04B 1/06
[52] U.S. Cl. ............................ 455/180.3; 455/183.2; 455/200.1; 455/260; 455/265; 375/376
[58] Field of Search ............... 455/180.3, 183.1, 183.2, 455/280.1, 260, 265; 375/106, 120

[56] References Cited

U.S. PATENT DOCUMENTS

| | | |
|---|---|---|
| 3,961,261 | 6/1976 | Pflasterer . |
| 3,962,644 | 6/1976 | Baker . |
| 4,092,594 | 5/1978 | Baker . |
| 4,114,103 | 9/1978 | Pflasterer . |
| 4,135,158 | 1/1979 | Parmet . |
| 4,156,193 | 5/1979 | Baker . |
| 4,179,662 | 12/1979 | Pflasterer . |
| 4,268,915 | 5/1981 | Parmet . |
| 4,355,414 | 10/1982 | Inoue ............................. 455/183.1 |
| 4,876,542 | 10/1989 | van Bavel et al. . |
| 4,901,151 | 2/1990 | Mehrgardt et al. . |
| 4,947,408 | 8/1990 | Sadr et al. . |
| 4,987,605 | 1/1991 | Nose . |
| 5,101,509 | 3/1992 | Lai ................................ 455/183.1 |
| 5,130,802 | 7/1992 | Ruprecht et al. . |
| 5,220,684 | 6/1993 | Suizu ............................ 455/183.1 |

FOREIGN PATENT DOCUMENTS

| | | |
|---|---|---|
| 2916171 | 10/1980 | Germany . |
| 2933416A1 | 3/1981 | Germany . |
| 41 04 882.2 | 8/1992 | Germany . |
| 2208767 | 4/1989 | United Kingdom . |

OTHER PUBLICATIONS

"The Art Of Digital Video" by John Watkinson, Chapter 5, pp. 136–154.
John Watkinson, "The Art of Digital Video", pp. 12–15, 40 and 41 on Conversion (published 1990).
Matijaz Vidmar, "Digitale Signalverarbeitungs-Techniken fur Funkamateure", Mar. 1988, pp. 136,137,152 and 153, UKW-Berichte.

Primary Examiner—Edward F. Urban
Assistant Examiner—Andrew Faile
Attorney, Agent, or Firm—Frishauf, Holtz, Goodman & Woodward

[57] ABSTRACT

Digital tuning of a locally generated frequency supplied to a frequency converting mixer, a mobile radio receiver is provided with great economy of components by utilizing the sampling rate oscillator for an analog-to-digital converter provided at the output of an analog intermediate frequency amplifier of the receiver as the source of the difference frequency for a phase locked loop (PLL) for control of the phase of a local oscillator for the mixer or mixers. All frequencies used to supply local oscillations to mixers, as well as the operating frequency of the phase locked loop are integer number multiples of the sampling rate pulse generator. Some division stages have fixed dividers and others have divisors selectable by a tuning processor and in some of the divisor connections it is useful to interpose a fixed or selectable-factor multiplier. A sampling rate of 42.75 MHz is recommended and an intermediate frequency amplifier frequency which is a rational number multiple of 57 kHZ, preferably 10.6875 MHz are similarly recommended.

6 Claims, 3 Drawing Sheets

Fig. 3

| BAND DESIGNATION | | FREQUENT RANGE (MHz) | L.OSC. FREQ (MHz) | L | Δf min. | RASTER SPACING (kHz) | ΔL OF RASTER | M | fpd (kHz) | N | K/2 |
|---|---|---|---|---|---|---|---|---|---|---|---|
| FM EUROPE | | 87.6–107.9 | 98.2875–118.5875 | 7863–9487 | 12.5 | 100 | 8 | 12 | 150 | 15 | — |
| | | | | | | | | 4 | 50 | 45 | |
| | | | | | | | | 1 | 12.5 | 180 | |
| FM USA | | 87.7–107.9 | 98.3875–118.5875 | 7871–9487 | 12.5 | 200 | 16 | 4 | 50 | 45 | — |
| | | | | | | | | 1 | 12.5 | 180 | |
| FM JAPAN | | 76.0–90.0 | 65.3125–79.3125 | 5225–6345 | 12.5 | 100 | 8 | 4 | 50 | 45 | — |
| | | | | | | | | 1 | 12.5 | 180 | |
| LW/MW EUROPE | | 0.153–1.602 | 97.5645–110.6055 | 21681–24579 | 0.5 | 9 | 18 | 10 | 45 | 50 | 9 |
| | | | | | | | | 1 | 4.5 | 500 | |
| MW USA & BRAZIL | | 0.530–1.71 | 100.9575–111.5775 | 40383–44631 | 5/18 | 10 | 36 | 20 | 50 | 900 | 9 |
| | | | | | | | | 1 | 2.5 | 45 | |
| MW JAPAN | | 0.552–1.629 | 67.2570–73.899 | 22419–24633 | 0.25 | 9 | 36 | 15 | 3 | 50 | 6 |
| | | | | | | | | 1 | 45 | 750 | |
| SW | 49m. | 5.85–6.30 | 109.6875–120.9375 | 43875–48375 | 0.1 | 5 | 50 | 20 | 2.5 | 45 | 25 |
| | | | | | | | | 1 | 50 | 900 | |
| | 38m. | 7.095–7.5 | 102–115 | 40800–43984 | 5/64 | 5 | 64 | 1 | 2.5 | 900 | 32 | ns
RADIO RECEIVER FOR MOBILE RECEPTION WITH SAMPLING RATE OSCILLATOR FREQUENCY BEING AN INTEGER-NUMBER MULTIPLE OF REFERENCE OSCILLATION FREQUENCY

This invention concerns a radio receiver used in vehicles and particularly a receiver having a circuit for analog-to-digital conversion of the intermediate frequency signal.

BACKGROUND AND PRIOR ART

Radio broadcast receivers using analog-to-digital conversion of the intermediate frequency signal have been known, for example, from the disclosure of DE 29 33 416.A1. Receivers there disclosed have processor controlled phase regulation stages as well as frequency dividers for setting digital frequencies.

In the publication "UKW-Berichte 3/88" at pages 136 to 155, digital signal processing techniques for radio amateurs are described, in which, among other things, a digitalized shortwave receiver is mentioned having a frequency synthesizer which can be set in 10 kHz steps. In this receiver there is a connection of a pulse generator to this frequency synthesizer. That pulse generator provides the clock frequency for a digital signal processor (DSP) and for a central processing unit (CPU), from which a connection line leads likewise to the frequency synthesizer. The pulse generator also supplies at a 40 kHz output the sampling pulses for a 16 bit analog-to-digital converter for the intermediate frequency signal.

Broadcast receivers with digitally settable receiving frequencies are also known from German patent 29 16 171, in which the front end circuits not directly connected to the frequency synthesizer are directly tuned by the microprocessor by means of a digital-to-analog converter.

In published German Patent application P 41 04 882 an analog-to-digital conversion of an intermediate frequency signal was proposed in the form of a so-called sigma-delta converter for the conversion of an analog signal into a serial data stream of which the clock frequency had a prescribed relation to the bandwidth of the intermediate frequency signal.

SUMMARY OF THE INVENTION

It is an object of the present invention to provide a simpler and more economical provision for assuring effective digital processing of an analog output of an intermediate frequency signal and a highly economic way of digitally tuning local oscillators of a mobile radio receiver for receiving all channels of interest for a mobile radio installation.

In the course of development of a receiver having an analog "front end" receiving portion in which an intermediate frequency signal was generated by suitable frequency conversion, followed by a digital signal processing portion introduced after an analog-to-digital converter at the output of the intermediate frequency amplifier, it was found that the frequency problems in the receiver can be overcome in a particularly simple way if, in accordance with the invention, the local oscillator of a mixer stage ahead of the intermediate frequency amplifier is controlled in phase with respect to a reference oscillator and if that reference oscillator for phase regulation of the local oscillator is also the sampling rate pulse generator of the analog-to-digital (A/D) converter.

In accordance with a preferred embodiment of the invention the sampling rate of the A/D converter has a frequency of 42.75 megahertz (MHz). From this sampling rate frequency there can then be derived the necessary frequencies of the local oscillator and of a frequency conversion (mixer) stage in the various wavelength ranges of reception, by means of frequency division of those frequencies with phase-locking at some convenient multiple of a submultiple of the sampling frequency. The divisors of the digital frequency dividers are whole numbers (integers) and the largest necessary dividing circuit can still be supplied with circuit elements for 16-place binary (digital) numbers.

In a further development of the invention there are also derived, from the sampling rate pulse generator, the necessary subcarrier for traffic announcements and radio data signals and the pilot frequency desirable for distinguishing the channels of a stereo audio transmission.

As further set forth below, it is often desirable to have a first mixer or frequency conversion stage for AM reception and a second mixer for VHF/FM reception and to have two or more dividing circuits all related to the digital sampling frequency, with appropriate interconnections with a frequency-band switch for selecting particular frequency ranges of reception.

BRIEF DESCRIPTION OF THE DRAWINGS

The invention is further described with reference to illustrative examples with reference to the annexed drawings, in which:

FIG. 3 is a table giving the frequency dividing ratios for each frequency-band of reception and for each of the frequency dividing circuits of FIG. 2, as well as the multiplier ratio of a frequency multiplier shown in FIG. 2.

DESCRIPTION OF THE ILLUSTRATED EMBODIMENT

Figure 1:
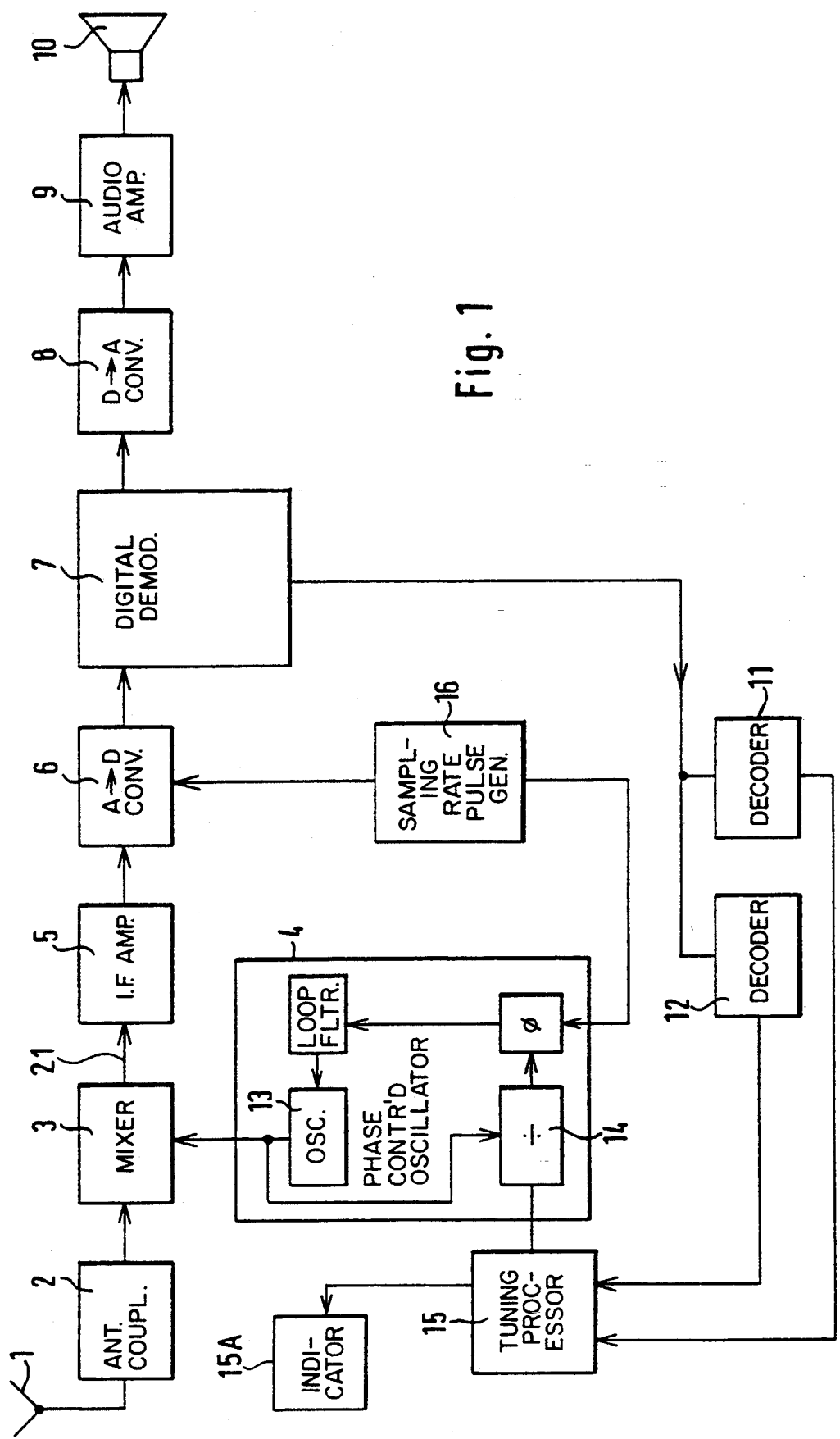
FIG. 1 is a circuit block diagram of a vehicular radio receiver according to the invention.

As shown in FIG. 1 the transmitted signal received by the antenna 1 passes through an antenna coupling stage 2 to the first input of a frequency mixers stage 3. The second input of the mixer 3 is connected to a local oscillator 4, as further described below.

In the frequency conversion stage 3,4 the useful signal portion of a desired broadcast station is converted in frequency from frequencies grouped around the radio carrier wave to frequencies straddling an intermediate frequency carrier selected in the design of the receiver. The output signal of the frequency conversion stage 3,4 (i.e. of the mixer 3) is amplified in the intermediate frequency stage 5 and is there limited in its bandwidth.

The signal processing in the signal path leading to the output of the intermediate amplifier stage 5 is on an analog basis. An analog-to-digital converter 6 is connected to the output of the intermediate frequency stage 5. An analog-to-digital converter suitable for use as the converter 6 is disclosed, for example, in the above mentioned German published patent application P 41 06 928. At the output of the analog-to-digital converter 6 there is connected a digital demodulator 7, the output of which contains all the useful information from the radio station transmitter to which the receiver is tuned. When the receiver is in mobile use, that information will consist of an acoustic program with announcements and may in many cases also include information on an auxiliary channel for traffic announcements and/or radio data system (RDS) signals.

The acoustic information signal is then digitally processed in the demodulator 7 with regard to loudness, tone etc. and is then reconverted into analog signals by the digital-to-analog converter 8. The output of the converter 8 is then amplified in an audio stage 9 and reproduced by a loudspeaker 10, whereas other information signals are evaluated and reported in suitable decoders 11 and 12. The natures of these decoders are by now well known and therefore do not need to be described further here.

The frequency converter 4 has a phase-regulated oscillator 13, the frequency of which is reduced by frequency division in a controllable frequency divider 14, the output of which is a reference frequency. The frequency division ratio is controlled by a tuning processor 15 which also, among other tasks, evaluates signals of the decoders 11 and 12 and indicates the results in a suitable indicator 15A.

The analog-to-digital converter 6 samples the analog intermediate frequency signal at regularly timed instants determined by a sampling rate oscillator or pulse generator 16. This sampling rate oscillator 16 also supplies the reference frequency for control of the phase of the local oscillator 13 of the frequency converter 3,4.

In the retrieval or evaluation of the useful information signal of the radio station to which the receiver is tuned it is important to include, in the digital processing portion of the receiver, means for generating an auxiliary carrier wave of 57 kHz and a 19 kHz pilot signal, for retrieving traffic announcements, RDS signals and stereo characteristics of audio signals. In consequence, for the avoidance of disturbing mixer products in the receiver, according to a further development of the invention, the frequency of the sampling rate pulse generator should be a integer number multiple of these two frequencies (in other words, a multiple of 57 kHz).

The most common commercially available intermediate frequency circuits are all designed for an intermediate frequency of 10.7 MHz. In the case of the receiver illustrated herein by way of example, the further development of the invention which has just been mentioned is embodied and the value of the intermediate frequency is chosen to be 10.6875 MHz, which is an integer number multiple of 57 kHz which comes the closest to 10.7 MHz.

The frequency of the sampling rate pulse generator 22 (FIG. 2) in the illustrated embodiment is 42.75 MHz, which is the fourfold value of the above selected value of the intermediate frequency.

Figure 2:
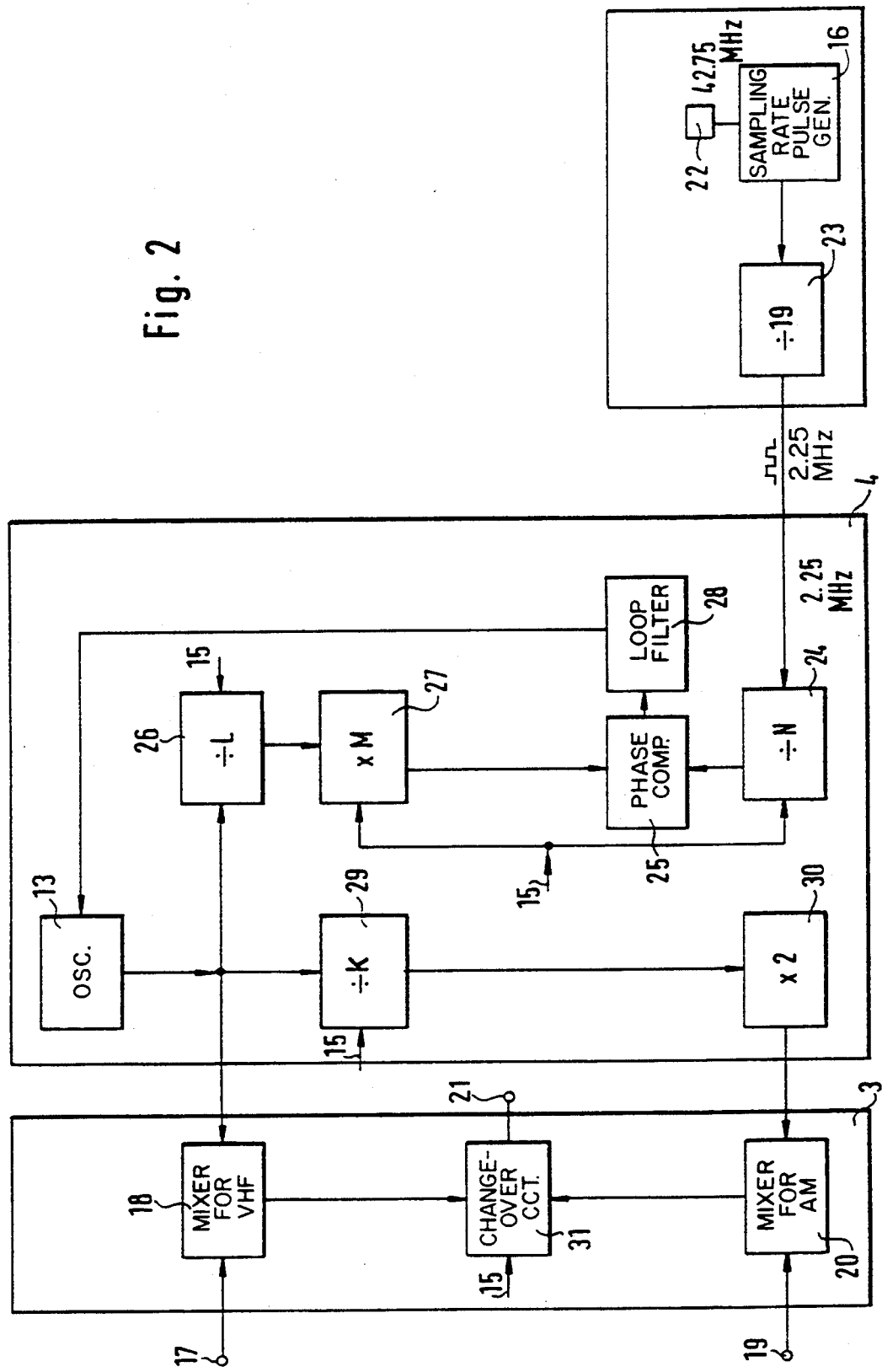
FIG. 2 is a circuit block diagram of a particularly suitable tuning and band-selecting circuit embodying the invention.

FIG. 2 shows in more detail the frequency mixing stage 3 and the control circuit and output circuits, as well as the oscillator circuit 13, all of which, together, make up the unit 4 of FIG. 1, and also the sampling rate pulse generator 16 and a few other components closely connected to it. The mixer stage 3 as shown in FIG. 2 consists of an input 17 for signals received from frequency modulated radio stations in the VHF frequency band and an input 19 for signals received from amplitude modulated signals of AM radio stations, whether they are in the long wave, medium wave or shortwave frequency bands. The input 17 is connected to the input of a VHF mixer 18, while the input 19 is connected to an AM mixer 20.

The radio stations in the above named frequency bands which are located respectively in Europe, the United States and Japan have respectively different frequency band limits. These can also be ascertained from the table of FIG. 3.

The sampling rate pulse generator 16, as already described, is also a reference oscillator for the variable local oscillator 13. In the now more completely described and illustrated example of FIG. 2, the frequency divider 14 of FIG. 1 is seen to be composed of the frequency divider 23, which divides the sampling rate by 19, and a further frequency divider 24 further described below. After the division by 19 there is provided at the output of the frequency divider 23 a rectangular oscillation having the frequency 2.25 MHz. That rectangular oscillation is further divided in the frequency division stage 24 by an integer number N, the value of which depends, on the one hand, on the radio frequency band in which radio reception takes place and, on the other hand, also on the operating frequency of the phase discriminator circuit 25, to which the output of the frequency division stage 24 is connected.

In the phase discriminator circuit 25 the frequency of the oscillation obtained from the frequency divider 24 is compared with a frequency which is derived from the frequency of the local oscillator 13, that derivation being produced by division of the local oscillator frequency by an integer number L in the frequency division stage 26. The magnitude of the number L depends upon the frequency assignment, within one of the frequency bands previously mentioned, of the radio station from which a signal is to be received. That station frequency may already be tuned in for the receiver by the listener. That is done by putting a suitable divisor number L in the divider 26 by means of the tuning processor 15 shown in FIG. 1.

In the illustrated embodiment the derivation of a signal from the local oscillator 13 for comparison in the phase comparison stage 25 is further derived from the divider 26 by a multiplier stage 27 using a multiplier factor M. The multiplier 27 is interposed between an output of the frequency division stage 26 and the phase comparison circuit 25. The factor M contributes to the determination of the operating frequency of the phase discriminator 25. The factor M and the number N are mutually dependent. If M is selected to be greater, the number N is to be correspondingly reduced.

A loop filter 28 is connected to the output of the phase discriminator circuit 25 and produces a low frequency output signal which corrects the phase of the local oscillator 13 in the case of a frequency deviation from the desired value of frequency or in the case of a change of radio stations to which the receiver is tuned.

The frequency of the local oscillator 13 is on the one hand directly mixed with the input signal at the signal input 17 in the VHF mixing stage 18 and, on the other hand, for mixing with a received AM input signal in the AM mixing stage 20, the local oscillator frequency is first divided in the frequency divider 29 by a divisor K, the value of which again depends upon the frequency assignment of the radio station which is to be received. Switching over of the reception frequency bands is produced, in the case of the choice of mixer stages, by the changeover circuit 31 of FIG. 2, controlled by the tuning processor 15 of FIG. 1. In the illustrated case, the frequency divider 29 is followed by a multiplier stage 30 which is a frequency doubler, before the delivery of the frequency divided local oscillator frequency to the mixer 20, a provision that is taken account of in the selection of the factor K. The provision of the frequency doubler 30 assures that nounsymmetrical disturbing frequencies will arise in the AM mixer 20.

As already mentioned, the outputs of the two mixing stages 20 and 18 are connected to a changeover switch 31 controlled by the tuning processor 15. The output 21 of the changeover switch 31 is designated as the output of the mixer stage 3 both in FIG. 1 and FIG. 2.

The table of FIG. 3 is based on the fact that the carrier frequencies of the individual radio stations from which signals are to be received in the several frequency bands of the receiver have a normalized frequency spacing from the neighboring carrier frequencies and thus must lie in a prescribed raster.

In the VHF region this standard frequency spacing is $f_{min}=100$ kHz. In order to retune the radio from one station to the next selection, the frequency of the local oscillator must accordingly be raised or lowered by at least 100 kHz. The new frequency of oscillator 13 must, after the freuqency division by L, again provide the operating frequency of the phase discriminator circuit 25. At the same time, L must allow itself to be represented as an integer number in the case of each newly selected radio station. Finally, the greatest necessary divisor L must also be capable of being represented by a 16 digit binary number. These requirements lead to the number values set forth in the table of FIG. 3. The frequency bands other than the FM bands are identified by wavelength ranges (long, medium and short—LW, MW and SW) in the first column of FIG. 3.

It follows from the above requirements that the fractions set forth below are equal and constant.

$$\frac{f_{osc,n}}{L} = \frac{f_{osc,n+1}}{L+1} = \text{const.}$$

It has been found that this frequency difference must be smaller than the frequency raster spacing if it is desired to operate with integer number divisors. In order to proceed from one radio station setting to the next, L must therefore be raised in every case by several units. The number of those units nevertheless remains the same within a particular frequency band.

The operating frequency of the phase regulating loop can be set at various values in the illustrated embodiment by means of the multiplier stage 27. In the reception of a radio station or in the case of tuning to neighboring stations one after another, a low operating frequency for the phase discriminator is advantageous. If, however, it is necessary to jump over a large frequency range for tuning to another radio station, then it is favorable to have a higher operating frequency for the phase discriminator.

According to the choice of that operating frequency the number N needs to be selected by which the reference frequency is lowered. When a change of the operating frequency is to be produced, the factor M in the multiplier stage 27 from the oscillator side of the discriminator circuit must be changed. The factor M must always be an integer number. The possibilities of variation for M and N are likewise illustrated in the table of FIG. 3.

The necessary condition that L should always be an integer number and also expressible by 16 bits leads to the development that the local oscillator 13, for reception of amplitude modulated carrier frequencies must be regulated with respect to a reference frequency that is not directly suitable as a local oscillator frequency. For that reason, the local oscillator frequency must be divided by various values of K for selection between the several different AM reception frequency bands.

The phase discriminator 25 is followed, as is indicated in FIG. 2, by a single loop filter 28. When 50 kHz is selected for the operating frequency of the phase discriminator, this operating frequency can be used in all wavelength ranges (frequency bands). When there is another choice of the operating frequency, at least two loop filters need to be provided, one for the VHF region and one for the AM frequency bands, since the region of stability of the phase-locked loop (PLL) varies with the operating frequency of the phase discriminator if there is no change of loop filter.

It can be seen from the table in FIG. 3 that in the VHF region the local oscillator frequency is reduced by 12.5 kHz when the number L is raised by one unit. In the AM reception bands the changes of the local oscillator frequency are correspondingly smaller.

If M=1 is selected for the VHF region, the operating frequency of the phase discriminator is set at 12.5 kHz. If a higher operating frequency is desired, then a greater value of the multiplier M must be selected and of course the divisor N must be correspondingly reduced.

These prescriptions for the numerical magnitude of the divisors result in a lower frequency limit for the local oscillator which is too great for the operation of a mixer stage in the AM frequency bands. Consequently, in these reception frequency bands the supplemental division of the frequency of the local oscillator by the divisor K is necessary.

Although the invention has been described with reference to a particular illustrative example, it will be recognized that variations and modifications are possible within the inventive concept.

We claim:

1. A radio receiver for mobile radio reception, comprising:

a frequency converter having a local oscillator and at least a first frequency mixer for mixing a received radio signal with oscillations of said local oscillator and producing an intermediate frequency signal;

an intermediate frequency amplifier for amplifying said intermediate frequency signal;

an analog-to-digital converter connected for converting said intermediate frequency signal, as amplified by said amplifier, from an analog signal to a digital signal and including a sampling rate oscillator having a predetermined sampling rate oscillator frequency for providing sampling pulses in said converter;

means for providing a reference oscillation frequency in response to said sample pulses from said sampling rate oscillator;

phase control circuit means, coupled to receive said reference oscillation frequency, for controlling the phase of said local oscillator of said frequency converter; and tuning processor means for selecting at least an integer ratio between said sampling rate oscillator frequency and said reference oscillation frequency such that the sampling rate oscillator frequency is greater than said reference oscillation frequency, and both said sampling rate oscillator frequency and said reference oscillator frequency are integer-number multiples of 57 KHz.

2. The radio receiver of claim 1, wherein the frequency of said sampling rate oscillator is 42.75 MHz and the frequency of said intermediate frequency signal is 10.6875 MHz.

3. A radio receiver for mobile radio reception, comprising:
   a frequency converter having a local oscillator and at least a first frequency mixer for mixing a received radio signal with oscillations of said local oscillator and producing an intermediate frequency signal;
   an intermediate frequency amplifier for amplifying said intermediate frequency signal;
   an analog-to-digital converter connected for converting said intermediate frequency signal, as amplified by said amplifier, from an analog signal to a digital signal and including a sample rate oscillator having a predetermined sampling rate oscillator frequency for providing sampling pulses in said converter;
   means for providing a reference oscillation frequency in response to said sampling pulses from said sampling rate oscillator;
   phase control circuit means, coupled to receive said reference oscillation frequency, for controlling the phase of said local oscillator of said frequency converter;
   tuning processor means for selecting at least an integer ratio between said sampling rate oscillator frequency and said reference oscillation frequency such that the sampling rate oscillator frequency is equal to 42.75 MHz and is an integer-number multiple of said reference oscillation frequency, and both said sampling rate oscillator frequency and said reference oscillator frequency are integer-number multiples of 57 KHz;
   said means for providing a reference oscillation frequency including a first frequency divider having an input connected to an output of said sampling rate oscillator and having an output connected to provide said reference oscillation frequency at a first input of said phase control circuit means, for controlling the phase of said local oscillator of said frequency converter, said first frequency divider including a frequency division stage having a switchable division ratio within said first frequency divider, all division ratios of all frequency division stages in said first frequency divider being chosen so that all divisors in all reception frequency bands are integer numbers;
   said tuning processor means including first switching means for changing the frequency division ratio of said first frequency divider;
   a second frequency divider having an input connected to an output of said local oscillator of said frequency converter and an output connected to a second input of said phase control circuit means;
   a second frequency mixer for FM reception located in said frequency converter, said local oscillator being directly connected to an output of said second frequency mixer and also being connected through a third frequency divider to said first frequency mixer for reception of AM signals; and
   a changeover switch for selectively connecting one of respective outputs of said first and second frequency mixers to an input of said intermediate frequency amplifier.

4. The radio receiver of claim 3,
   further comprising a multiplier interposed between said second frequency divider and said phase control circuit means, said second frequency divider and said multiplier being switchable by said tuning processor means for selecting an integer number ratio of an operating frequency of said local oscillator equal to said reference oscillation frequency, and
   wherein said changeover switch is controlled by said tuning processor means and said first and second frequency dividers each have a divisor set forth in a predetermined and said multiplier has a multiplier factor set forth in said predetermined table.

5. The radio receiver of claim 3 wherein said third frequency divider is a switchable frequency divider, and there are interposed, between said local oscillator and said first frequency mixer, said switchable frequency divider and a frequency doubler.

6. The radio receiver of claim 1, wherein the sampling rate oscillator frequency is an integer-number multiple of said reference oscillation frequency.

* * * * *